US012563990B2

(12) United States Patent
Lin et al.

(10) Patent No.: US 12,563,990 B2
(45) Date of Patent: Feb. 24, 2026

(54) DENSIFICATION AND REDUCTION OF SELECTIVELY DEPOSITED Si PROTECTIVE LAYER FOR MASK SELECTIVITY IMPROVEMENT IN HAR ETCHING

(71) Applicant: Tokyo Electron Limited, Tokyo (JP)

(72) Inventors: Jinying Lin, Albany, NY (US); Minjoon Park, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 540 days.

(21) Appl. No.: 18/090,434

(22) Filed: Dec. 28, 2022

(65) Prior Publication Data

US 2024/0222132 A1     Jul. 4, 2024

(51) Int. Cl.
| | |
|---|---|
| *H01L 21/308* | (2006.01) |
| *H01L 21/033* | (2006.01) |
| *H01L 21/3065* | (2006.01) |
| *H01L 21/311* | (2006.01) |
| *H01L 21/321* | (2006.01) |
| *H01L 21/3213* | (2006.01) |

(52) U.S. Cl.
CPC ...... *H01L 21/3086* (2013.01); *H01L 21/0337* (2013.01); *H01L 21/3065* (2013.01); *H01L 21/30655* (2013.01); *H01L 21/3081* (2013.01); *H01L 21/31116* (2013.01); *H01L 21/31144* (2013.01); *H01L 21/321* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 11,087,989 B1 * | 8/2021 | Garcia De Gorordo | H01L 21/02263 |
| 2017/0125255 A1 | 5/2017 | Kakimoto et al. | |
| 2019/0148398 A1 | 5/2019 | Kim et al. | |
| 2020/0066540 A1 * | 2/2020 | Hudson | H01L 21/31116 |
| 2020/0135487 A1 * | 4/2020 | Lee | H01L 21/0337 |
| 2021/0159082 A1 | 5/2021 | Lutker-Lee et al. | |
| 2021/0375633 A1 * | 12/2021 | Suda | H01L 21/32137 |

OTHER PUBLICATIONS

International Search Report and Written Opinion on PCT App. PCT/US2023/035994 dated Feb. 14, 2024 (9 pages).

* cited by examiner

*Primary Examiner* — Jiong-Ping Lu
(74) *Attorney, Agent, or Firm* — Foley & Lardner LLP

(57) ABSTRACT

Methods for the fabrication of semiconductor devices are disclosed. A method may include depositing a mask layer on a substrate, forming a protection layer on the mask layer, and modifying the protection layer such that a porosity of the protection layer is reduced. Modifying the protection layer may include densifying the protection layer. Modifying the protection layer may include reducing the protection layer using a hydrogen plasma. The method may include etching the protection layer and the substrate. Etching may include etching, forming the protection layer, and modifying the protection layer in a predetermined number of cycles.

20 Claims, 18 Drawing Sheets

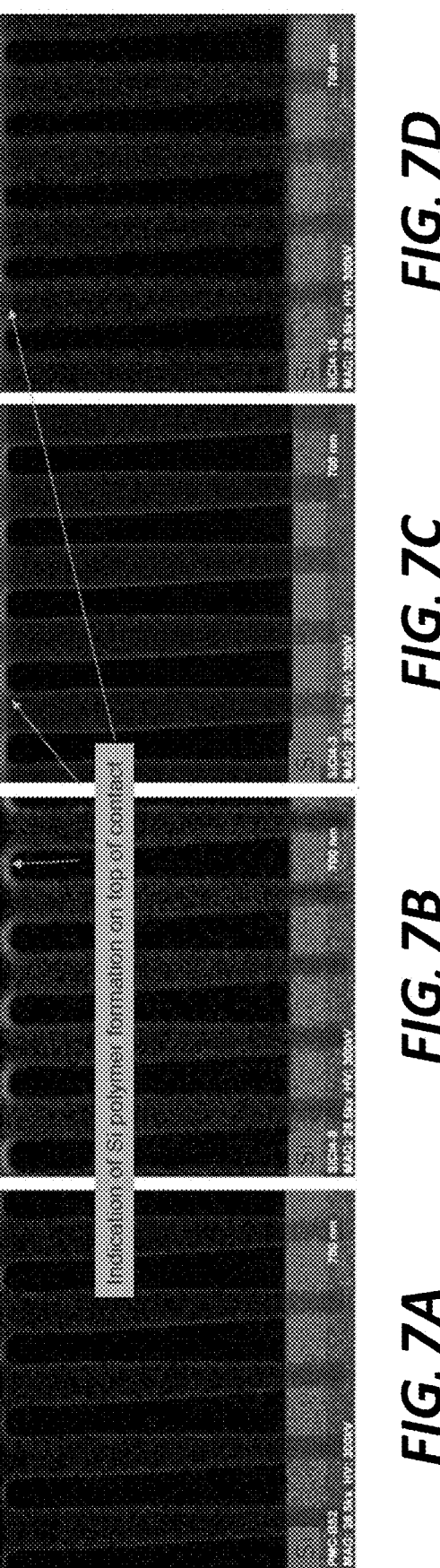
*FIG.7D*    *FIG.7C*    *FIG.7B*    *FIG.7A*

1205

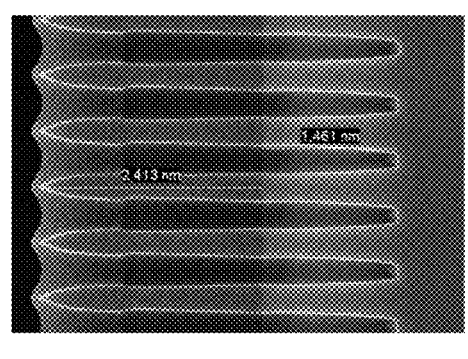
*FIG. 13D*
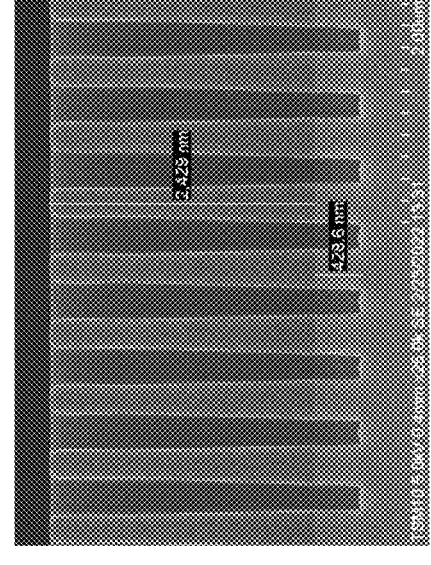
*FIG. 13A*
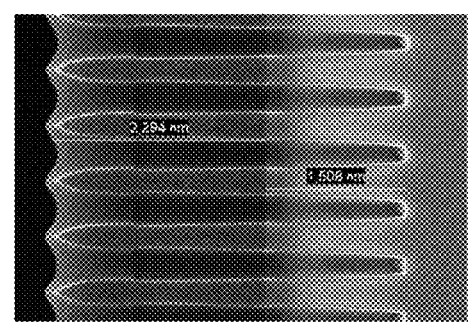
*FIG. 13C*
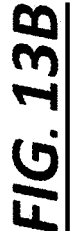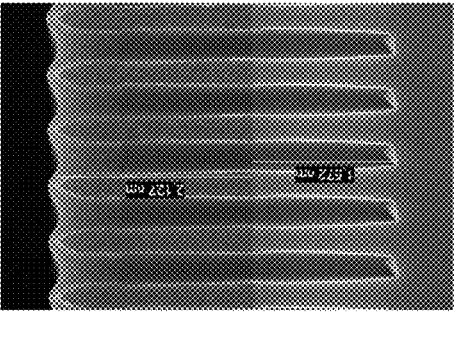
*FIG. 13B*

1400

Deposit a mask layer on a substrate 1405

Form a protection layer on the mask layer 1410

Modify the protection layer such that a porosity of the protection layer is reduced 1415

Etch the protection layer and the substrate 1420

1500

Deposit a mask layer on a substrate 1505

Form a protection layer on the mask layer 1510

Densify the protection layer using argon sputtering 1515

Etch the protection layer and the substrate 1520

1600

Deposit a mask layer on a substrate 1605

Form a protection layer on the mask layer 1610

Reduce the protection layer in part by exposing the protection layer to a hydrogen treatment 1615

Etch the protection layer and the substrate 1620

DENSIFICATION AND REDUCTION OF SELECTIVELY DEPOSITED Si PROTECTIVE LAYER FOR MASK SELECTIVITY IMPROVEMENT IN HAR ETCHING

FIELD OF THE DISCLOSURE

This disclosure relates to densification and reduction in selectively deposited protective layers in semiconductor device manufacturing.

BACKGROUND

In the manufacture of semiconductor devices (especially on the microscopic scale), various fabrication processes are executed, for example, film-forming depositions, etch mask creation, patterning, material etching and removal, and doping treatments, among others. These processes can be performed repeatedly to form desired semiconductor device elements on a substrate.

SUMMARY

Fabrication techniques for manufacturing semiconductor devices include the use of etching, or the removal of material, to form features into substrate materials. Developments in semiconductor manufacturing strive to achieve smaller semiconductor devices in order to create denser and more power-efficient circuitry. Accurate etching becomes more challenging as the size of the features being etched decreases (e.g., an increasing aspect ratio). Etching techniques such as high-aspect ratio (HAR) etching are becoming more popular, but also suffer from several drawbacks. For example, performing HAR etching to etch features defined by a hard mask layer may result in mask erosion due to ion bombardment. This can lead to etch deformities such as necking, bowing, or a worse B/T ratio, among other types of distortion.

The techniques described herein include processes for improving mask selectivity by providing a protection layer that is densified using a gas mixture. In an example, hydrogen ($H_2$) and gases containing silicon (Si) can be used to form a protection layer on top of a mask layer, and then argon (Ar) and hydrogen ($H_2$) can be used to densify or reduce the protection layer (e.g., reduce the porosity of the protection layer). The densified or reduced protection layer protects the mask layer from erosion during energetic ion bombardment, thereby resulting in increased etch resolution and accuracy.

Of course, the order of discussion of the different steps as described herein has been presented for clarity's sake. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the present invention can be embodied and viewed in many different ways.

One embodiment is directed to a method. The method may comprise depositing a mask layer on a substrate; forming a protection layer on the mask layer; modifying the protection layer such that a porosity of the protection layer is reduced; and etching the protection layer and the substrate. The mask layer may include a hard mask comprising silicon or metal materials. The mask layer may include a hard mask comprising an amorphous carbon layer. Forming the protection layer may include exposing the mask layer to a $SiH_4$ plasma. Modifying the protection layer may include densifying the protection layer using argon, helium, krypton, or xenon sputtering. Modifying the protection layer comprises exposing the protection layer to a hydrogen plasma.

The method may include forming a second protection layer on the mask layer after etching the protection layer and the substrate; modifying the second protection layer such that a porosity of the second protection layer is reduced; and etching the second protection layer and the substrate. The protection layer comprises a pseudo-silicon material. Forming the protection layer may increase an etch resistance of the mask layer. Forming the mask layer may comprise forming a trench or hole in the mask layer that exposes a portion of the substrate.

Another embodiment is directed to another method. The method may comprise depositing a mask layer on a substrate; forming a protection layer on the mask layer; densifying the protection layer using argon sputtering; and etching the protection layer and the substrate.

The mask layer may comprise a hard mask comprising silicon or metal materials. The mask layer may comprise a hard mask comprising an organic mask such as an amorphous carbon layer. The method may comprise forming a second protection layer on the mask layer after etching the protection layer and the substrate; modifying the second protection layer such that a porosity of the second protection layer is reduced; and etching the second protection layer and the substrate. Modifying the second protection layer may comprise exposing the second protection layer to a hydrogen plasma.

Yet another embodiment is directed to yet another method. The method may comprise depositing a mask layer on a substrate; forming a protection layer on the mask layer; reducing the protection layer in part by exposing the protection layer to a hydrogen treatment; and etching the protection layer and the substrate.

The method may comprise forming a second protection layer on the mask layer after etching the protection layer and the substrate; densifying the second protection layer using argon sputtering; and etching the second protection layer and the substrate. Depositing the mask layer may comprise forming a trench or a hole in the mask layer that exposes a portion of the substrate. Etching the substrate may be performed via the trench or the hole in the mask layer. Forming the protection layer may comprise forming the protection layer such that a portion of the substrate is exposed via the mask layer.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 7A, 7B, 7C, and 7D show energy-dispersive detector (EDS) scans showing the formation of a silicon polymer layer on top of an ACL, according to an embodiment.

FIGS. 12A, 12B, 13C, 12D, 12E, 12F, 12G, and 12H show example EDS scans of an example material stack on which a protection layer has been deposited and densified, according to an embodiment.

FIGS. 13A, 13B, 13C, and 13D show example photographs of an example layer stack that has undergone a HAR etching process using the techniques described herein, according to an embodiment

DETAILED DESCRIPTION

Figure 1B:
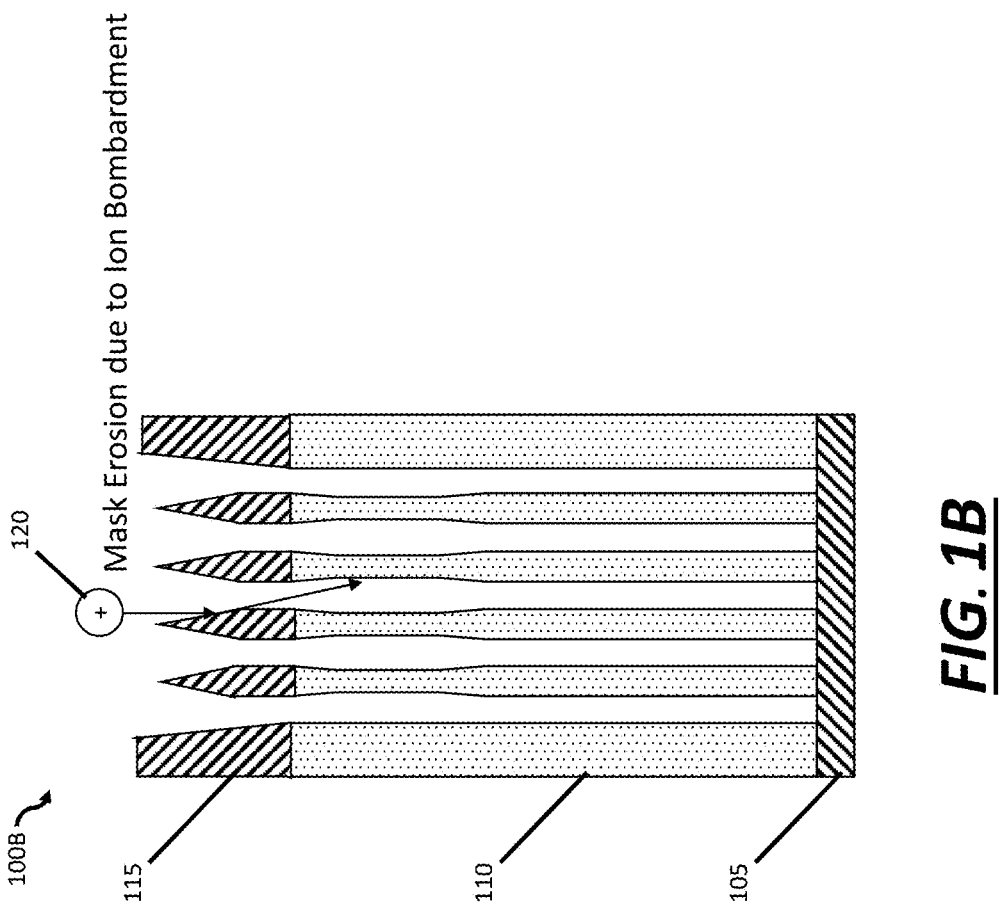
FIGS. 1A and 1B show cross-sectional views of a substrate before and after etching, without utilizing the techniques described herein relating to a densified protection layer, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Techniques described herein include providing and densifying a protection layer, which can improve mask selectivity during HAR (e.g., high-aspect ratio contact (HARC)) etching processes. HAR etching is useful for a range of technologies, including manufacturing techniques for semiconductor memory, such as dynamic random access memory (DRAM) and NAND memories. The demands for increased memory density have in turn increased the desired aspect ratio of HAR etching processes, due to the reduction in feature size of the components of said memories. For example, performing HAR etching to etch features defined by a hard mask layer may result in mask erosion due to ion bombardment. This can lead to etch deformities such as necking, bowing, or a worse B/T ratio, among other types of undesired substrate distortion. The techniques described herein can address these and other issues by providing a protection layer, which is densified to improve mask selectively, to protect the mask from erosion during HAR etching. The protection layer can be formed using a suitable material, such as silicon, and can be densified using argon or hydrogen treatments.

The advantages of the techniques described herein include reducing the mask selectivity degradation at higher aspect ratios, thereby obviating the need for thicker hard masks during HAR etching. This generally improves the potential aspect ratio of HAR etching processes. Additionally, the present techniques can be implemented with minimal modifications to the HAR etching process (e.g., the introduction of one or more additional gas lines).

Reference will now be made to the figures, some of which illustrate a variety of materials undergoing portions of process flows one or more views, for the convenience of visualizing the techniques described herein. In the various views of the figures, although particular semiconductor structures, including circuitry connections or other types of structures, may not be shown for ease of visualization, it should be understood that the techniques described herein can be implemented using stacks of materials that include a variety of material structures. Such material structures may include semiconductor structures or connections between various layers, masks, or materials that may be implemented in any configuration to create electric or electronic circuits. The example structures described herein are merely illustrative and are intended to show a capability for performing the techniques described herein and should not be considered limiting to the scope of the claims.

Likewise, although the figures and aspects of the disclosure may show or describe structures herein as having a particular shape, it should be understood that such shapes are merely illustrative and should not be considered limiting to the scope of the techniques described herein. For example, the techniques described herein may be implemented in any shape or geometry for any material or layer to achieve desired results. Further, although the techniques described herein are described as benefiting a HAR etching process, it should be understood that other types of etching processes may also benefit from these techniques.

Figure 1A:
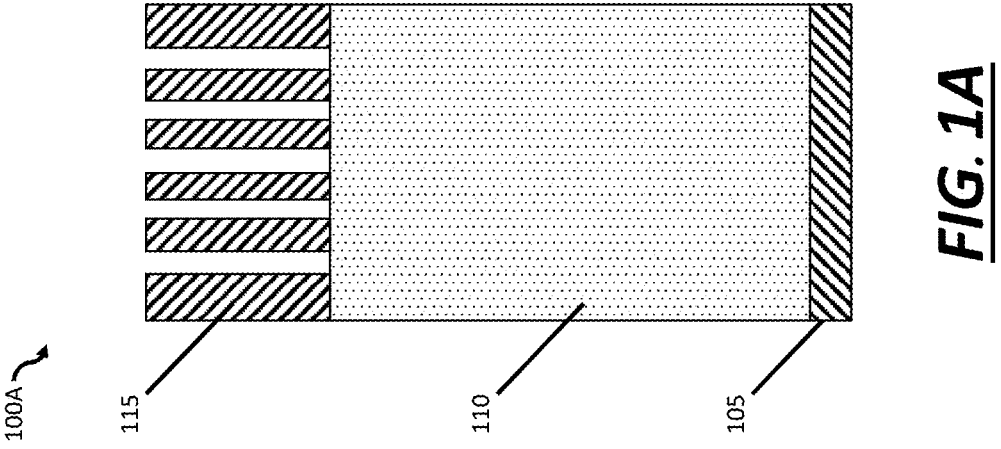

FIGS. 1A and 1B show cross-sectional views 100A and 100B of a substrate before and after an etching process that does not implement the techniques described herein. As shown in FIG. 1A, a substrate layer 110, which will be subjected to an etching process (e.g., a HAR etching process) can be formed on a base layer 105. The base layer 105 can be formed from silicon, a dielectric material, or any other type of suitable material. The substrate layer 110 can be, for example, a layer of a silicon material, a semiconductive-behaving material, a dielectric material, a metal material, or any other type of material that may be subjected to an etching process.

To etch the substrate material 110, a layer of a hard mask material 115 can first be patterned on the substrate material 110. The hard mask material 115 can be patterned, for example, using photolithographic techniques or other types of patterning techniques. The hard mask material 115 can define the regions of the substrate material 110 that will be etched (e.g., the regions not covered by the hard mask material 115, the exposed portions of the substrate material 110). The hard mask material 115 can be any suitable masking material, including an amorphous carbon layer or an amorphous silicon layer, among others. As shown in the cross-sectional view 100A, the hard mask material 115 has been formed on the substrate layer 110 to form a number of trenches, which define the regions of the substrate material 110 that will be etched.

Referring to FIG. 1B, illustrated is a cross-sectional view 100B of the material stack shown in FIG. 1A following an etching process that does not utilize the techniques described herein. As shown, ions 120 used in an example etching process have eroded the hard mask material 115. This erosion creates irregular geometry in the hard mask material 115, causing the ions 120 to cascade and strike the substrate material 110 in unintended ways. In this example, the eroded hard mask material 115 results in a bowing effect, where portions of the substrate material 110 are over-etched, as shown. As described herein, the present techniques provide a protection layer that increases mask selectively, thereby resulting in etching without distortion of the substrate material 110.

Figure 2:
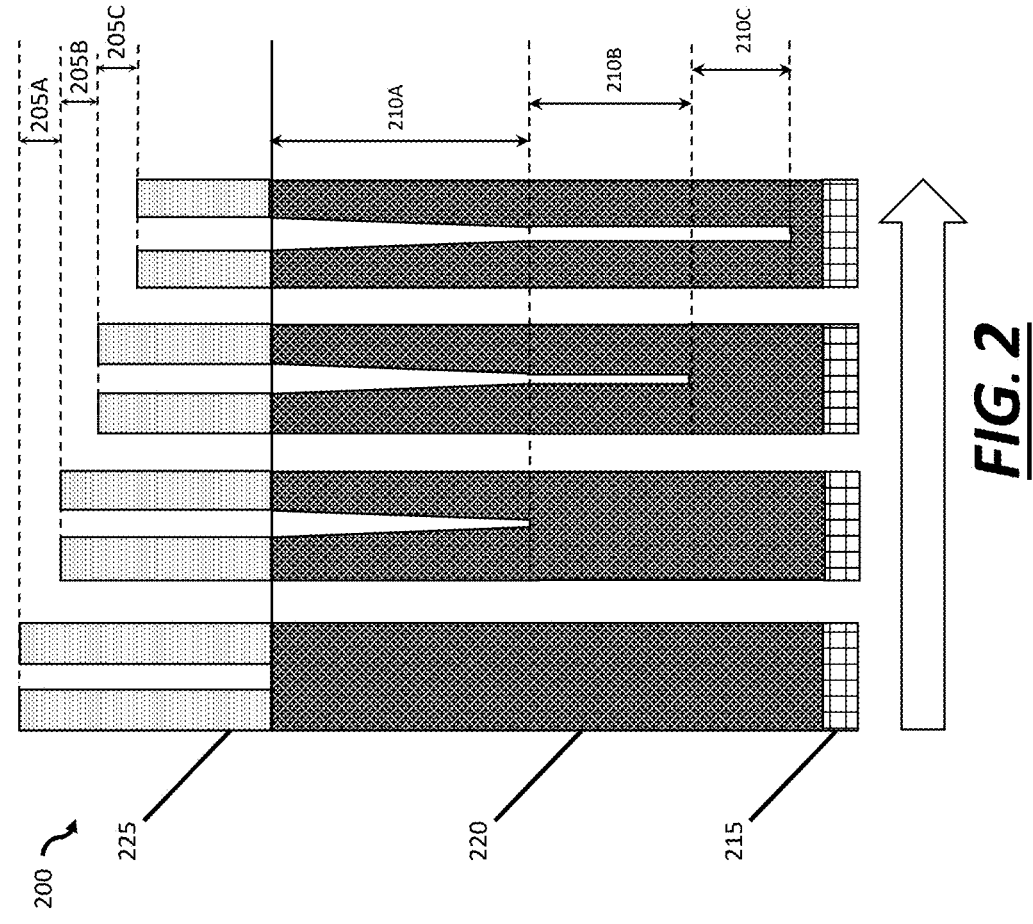
FIG. 2 shows a cross-sectional diagram illustrating how an etch rate decreases as the etching progresses, according to an embodiment.

Referring to FIG. 2, illustrated is a cross-sectional diagram 200 illustrating how an etch rate of etching deeper material decreases as the etching process progresses, according to an embodiment. The diagram 200 shows a stack of materials that includes a base layer 215, a substrate layer 220, and a patterned hard mask layer 225 (each of which may be similar to the base layer 105, the substrate layer 110, and the hard mask layer 115, respectively, of FIG. 1A). As shown, as an etching process progresses, the change in the etching rate of the substrate material 220 (which may include silicon or metal materials) is different from the change in the etching rate of the hard mask layer 225. At three subsequent time intervals during the etching process, the hard mask layer 225 has been etched by the amounts 205A, 205B, and 205C, each of which are about equal. This indicates a constant etch rate for the hard mask material 225. In contrast, the substrate material 220 has been etched by the amounts 210A, 210B, and 210C over the same three consecutive time periods. The amounts 210A, 210B, and 210C decrease as the etching process progresses, indicating that the etch rate of the substrate material 220 decreases over time.

Figure 3:
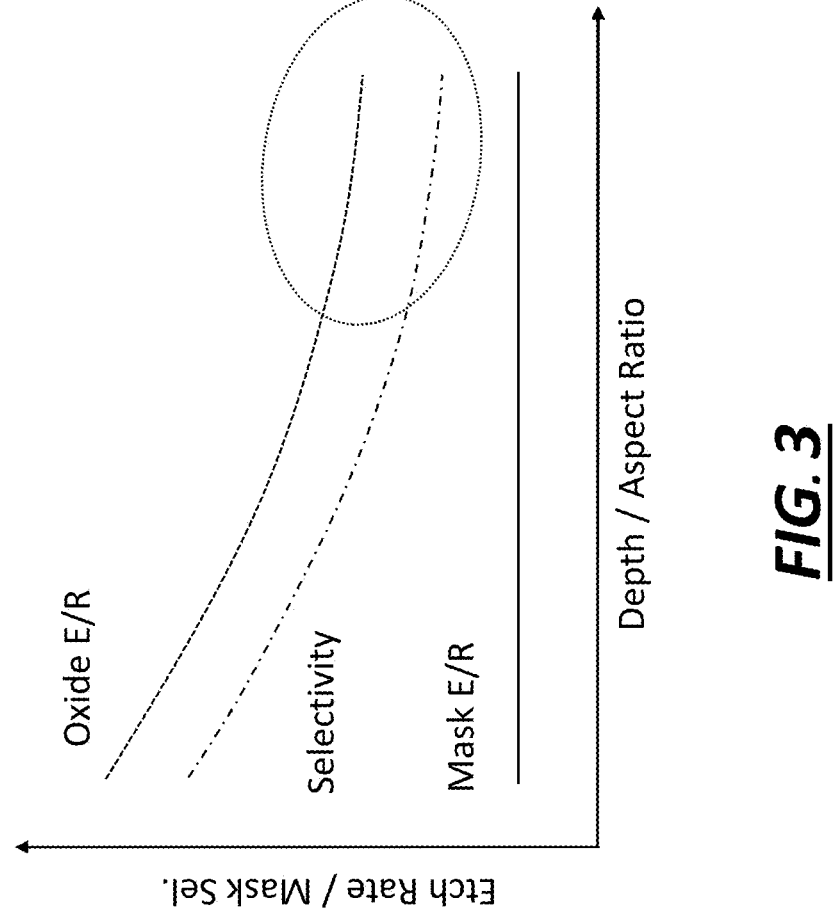
FIG. 3 shows an example graph depicting a relationship between an oxide etch rate and mask selectivity match rate, according to an embodiment.

Referring to FIG. 3, illustrated is an example graph 300 depicting the relationship between the substrate 220 (shown in the graph as "oxide") etch rate and the hard mask etch rate, according to an embodiment. The relationships in the graph 300 reflect a similar pattern as to the etching amounts shown in FIG. 2, namely that the etching rate for the substrate material 220 decreases as the etching time increases, while the etching rate for the hard mask layer remains constant. This is because, as the etching process progresses in the substrate layer, the distance the ions must travel is farther, and the ion and radical density decreases with that increased distance. As shown, this causes the mask etch selectivity to decrease as the etching time increases, resulting in reduced performance and increasing the risk of etch distortion in the substrate layers during etching.

Referring to FIGS. 4A, 4B, 4C, 4D, and 4E, illustrated is an example HAR etching process that utilizes the protection layer deposition and densification techniques described herein, according to an embodiment. Each of FIGS. 4A, 4B, 4C, 4D, and 4E generally refer to one or more process steps in a process flow, each of which is described in detail in connection with a respective figure. For the purposes of simplicity and ease of visualization, some reference numbers may be omitted from some figures.

Figure 4B:
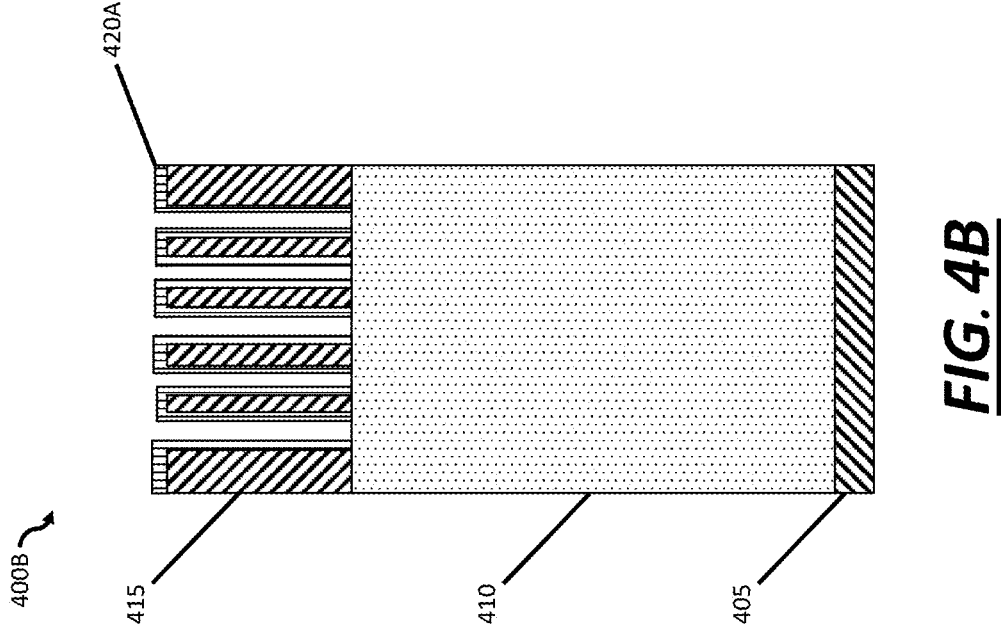
FIGS. 4A, 4B, 4C, 4D, and 4E show cross-sectional views of an example HAR etching process that utilizes the techniques described herein, according to an embodiment.
Figure 4A:
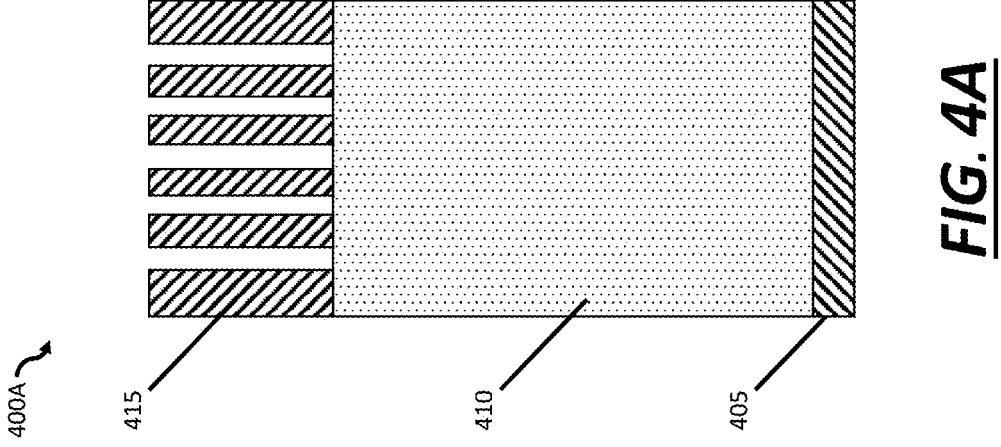

) Referring to FIG. 4A, illustrated is a cross-sectional view 400A of an example material stack, which can include a base layer 405, a substrate layer 410, and a mask layer 415 (each of which may be similar to the base layer 105, the substrate layer 110, and the mask layer 115 of FIG. 1A, respectively). FIG. 4A shows the material stack prior to any etching process. The base layer 405 can be formed from silicon, a dielectric material, or any other type of suitable material that may operate as an etch-stop layer. The substrate layer 410 can be, for example, a layer of silicon or metal materials, a semiconductive-behaving material, a silicon material, a dielectric material, a metal material, or any other type of material that may be subjected to an etching process.

To etch the substrate material 410, a layer of a hard mask material 415 can first be patterned on the substrate material 410. The hard mask material 415 can be patterned, for example, using photolithographic techniques or other types of patterning techniques. The hard mask material 415 can define the regions of the substrate material 410 that will be etched (e.g., the regions not covered by the hard mask material 415 and any exposed portions of the substrate material 410). The hard mask material 415 can be any suitable masking material, including an amorphous carbon layer or the like. As shown in the cross-sectional view 400A, the hard mask material 415 has been selectively deposited on the substrate layer 410 to form a number of trenches, which define the regions of the substrate material 410 that will be etched.

Referring to FIG. 4B, illustrated is a cross-sectional view 400B of the material stack in FIG. 4A following the deposition and densification of a first protection layer 420A. The first protection layer 420A can be silicon film or a pseudo-silicon film that is selectively deposited over the hard mask layer 415 and a portion of the substrate layer 410. After depositing the first protection layer 420A, a directional etch can be performed to expose a top portion of the substrate layer 410, as shown, with the first protection layer 420A remaining on the hard mask layer 415 and the sidewalls of the substrate layer 410.

The first protection layer 420A can serve as a protection layer from reactive etchants and ion bombardment, due to strong bonds formed between the first protection layer 420A and the hard mask layer 415. The first protection layer 420A can be deposited using any suitable deposition technique, such as chemical vapor deposition (CVD), atomic layer deposition (ALD), or physical vapor deposition (PVD), among others. Following deposition, a densification process can be applied to the first protection layer 420A. The densification process performed can be similar to the densification process described in connection with FIGS. 5A-5G. The densification process reduces the porosity of the first protection layer 420A, improving the etch-resistance of the first protection layer 420A.

Figures 4C, 4D, 4E:
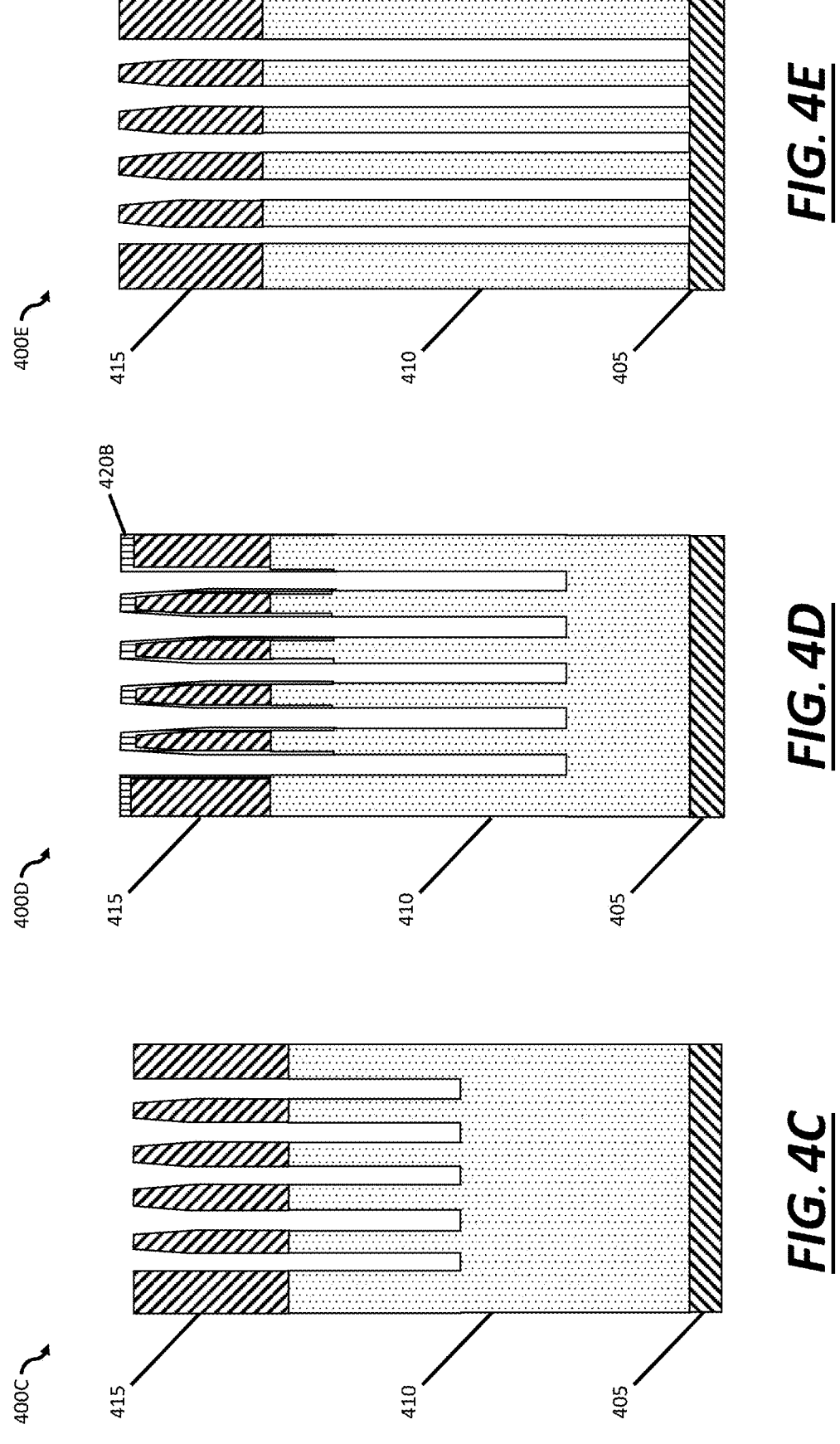

Referring to FIG. 4C, illustrated is a cross-sectional view 400C of the material stack of FIGS. 4A and 4B, following an etching process. The etching process can be any suitable etching process, such as a HAR etching process. As shown, the etching process results in the removal of the first protection layer 420A, partial etching of the hard mask layer 415, and partial etching of the substrate layer 410. The etching process can be performed for a predetermined amount of time, for example, until the first protection layer 420A has been eroded, or a predetermined amount of the substrate layer 410 or the hard mask layer 415 has been etched. The process shown in FIGS. 4B and 4C can be repeated until a predetermined etching termination has been reached.

In an example etch process, a high frequency source power in a range of 500-7000 W, a low frequency bias power in a range of 0-32 kW, a pressure in a range of 7-800 mTorr, and a temperature in a range of 10-80 degrees Celsius may be utilized. Example gases that may be utilized in the etching process may include fluorocarbon-containing gases (e.g., $C_4F_6$ in the range of 0-412 sccm, $C_4F_8$ in the range of 0-352 sccm, $CH_2F_2$ in the range of 0-187 sccm, $CHF_3$ in the range of 0-313 sccm). In some embodiments, the gas may be utilized in combination with oxygen-containing gases (such as $O_2$) in the range of 90-935 sccm or one or more dilution gases, such as krypton (Kr) in the range of 0-306 sccm or argon (Ar) in the range of 0-1420 sccm. Additional gases that may be used also include, but are not limited to, other fluorocarbon-containing gases (such as, e.g., $C_3F_8$ in the range of 0-222 sccm and $CF_4$ in the range of 0-336 sccm), carbon monoxide (CO) in the range of 0-1000 sccm, and nitrogen ($N_2$) in the range of 0-500 sccm.

Referring to FIG. 4D, illustrated is a cross-sectional view 400D of the material stack in FIG. 4C following additional etching processes. As shown, a second protection layer 420B has been deposited and densified, using techniques similar to those described herein. The second protection layer 420B can be silicon film or a pseudo-silicon film that is selectively deposited over the hard mask layer 415 and a portion of the substrate layer 410. After depositing the second protection layer 420B, a directional etch can be performed to expose a top portion and a portion of the sidewalls of the substrate layer 410, as shown. The second protection layer 420B can remain on the hard mask layer 415 and on a portion of the sidewalls of the substrate layer 410.

Like the first protection layer 420A, the second protection layer 420B can serve as a protection layer from reactive etchants and ion bombardment, due to strong bonds formed between the second protection layer 420B and the hard mask layer 415. The second protection layer 420B can be deposited using any suitable deposition technique, such as CVD, ALD, or PVD, among others. Following deposition, a densification process can be applied to the second protection layer 420B. The densification process performed can be similar to the densification process described in connection with FIGS. 5A-5G. The densification process reduces the porosity of the second protection layer 420B, improving the etch-resistance of the second protection layer 420B.

Referring to FIG. 4E, illustrated is a cross-sectional view 400E of the material stack as shown in FIG. 4D, following an additional etching process. The etching process can be any suitable etching process, such as a HAR etching process. As shown, the etching process results in the removal of the second protection layer 420B, partial etching of the hard mask layer 415, and etching of the substrate layer 410 to the base layer 405. The etching process can be performed for a predetermined amount of time, for example, until the second protection layer 420B has been eroded, or until the substrate layer 410 has been etched to an etch stop layer (e.g., the base layer 405).

Referring to FIGS. 5A, 5B, 5C, 5D, 5E, 5F, and 5G, illustrated is an example process flow for the formation and densification of a protection layer that may be utilized in the techniques described herein, according to an embodiment. Each of FIGS. 5A-5G generally refer to one or more process steps in a process flow, each of which is described in detail in connection with a respective figure. For the purposes of simplicity and ease of visualization, some reference numbers may be omitted from some figures. Although the techniques described in connection with FIGS. 5A-5G are shown as being deposited on an ACL, it should be understood that any number of materials, including alternative materials, may be utilized in connection with the present techniques. For example, a number of layers and materials may be included in a material stack on which a protection layer is deposited and densified. A single ACL is shown for visual clarity and should not be considered limiting to the claims.

Figures 5A, 5B, 5C:
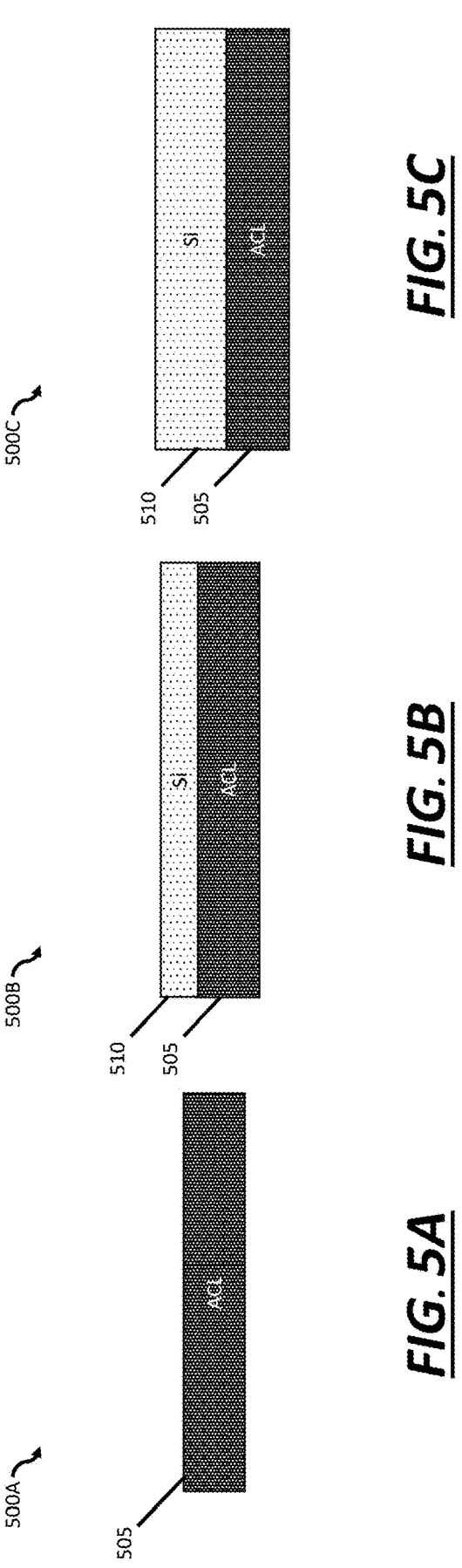
FIGS. 5A, 5B, 5C, 5D, 5E, 5F, and 5G show example formation and densification processes for a protection layer, according to an embodiment.

Referring to FIG. 5A, illustrated is a cross-sectional view 500A of an example material stack, which can include a mask layer 505. FIG. 5A shows the material stack prior to the formation and densification of a protection layer. The protection layer deposition techniques described in connection with FIGS. 5A-5G may be utilized with the process steps described in connection with FIGS. 4A-4E, for example. The mask layer 505 can be formed from any suitable masking material, including dielectric materials or an amorphous carbon material. As shown here, the mask layer 505 can be an ACL. Although not shown here, the mask layer 505 may be formed on a substrate layer, which may include a layer of silicon or metal materials, a semi-conductive-behaving material, a silicon material, a dielectric material, a metal material, or any other type of material that may be subjected to an etching process.

Referring to FIG. 5B, illustrated is a cross-sectional view 500B of the next stage in the process flow, in which a protection layer 510 is formed on the mask layer 505. The protection layer may be deposited using any suitable material formation technique, including but not limited to including an in-situ process in a plasma etcher, ALD, CVD, PVD, or PECVD, among others. The protection layer 510 can serve as a protection layer from reactive etchants and ion bombardment, due to strong bonds formed between the protection layer 510 and the hard mask layer 505. In this example, the protection layer 510 is shown as a silicon (Si) film. However, it should be understood that alternative materials may also be utilized. At this stage in the process flow, the example Si film is very porous, with many dangling bonds.

In an example material formation process for the protection layer 510, a high-frequency source power in a range of 0-1500 W, a low-frequency bias power in a range of 0-1900 W, a pressure in a range of 5-700 mTorr, and a temperature in a range of 0-90 degrees Celsius may be utilized. Gases utilized in the deposition process may include, but are not limited to, silicon-containing gases (e.g., $SiCl_4$, $SiH_4$) in a range of 5-50 sccm and hydrogen ($H_2$) in the range of 5-485 sccm. In some embodiments, additional process gases that may be used to deposit the Si or pseudo-Si protection layer 510 can include, but are not limited to, argon (Ar) in the range of 15-1150 sccm, krypton (Kr) in the range of 0-306 sccm, helium (He) in the range of 24-2387 sccm, nitrogen ($N_2$) in the range of 15-1300 sccm, and boron trichloride ($BCl_3$) in the range of 6-177 sccm.

Referring to FIG. 5C, illustrated is a cross-sectional view 500C of the continued formation of the protection layer 510, after the material formation process has progressed and the thickness of the protection layer 510 has increased. As described herein, the protection layer 510 may be deposited using any suitable material formation technique, including but not limited to ALD, CVD, PVD, or PECVD, among others. As the formation process is performed for increasing amounts of time, the thickness of the protection layer 510 increases. However, the material deposition process can cause the protection layer 510 to be porous, which can result in deformation during a future etching process. In this example where the protection layer 510 is a Si film, as the protection layer 510 gets thicker, the Si atoms bond together over time, thereby reducing the number of dangling Si bonds. This can help reduce porosity over time, but may not reduce porosity enough to eliminate deformities during HAR etching.

Figures 5D, 5E:
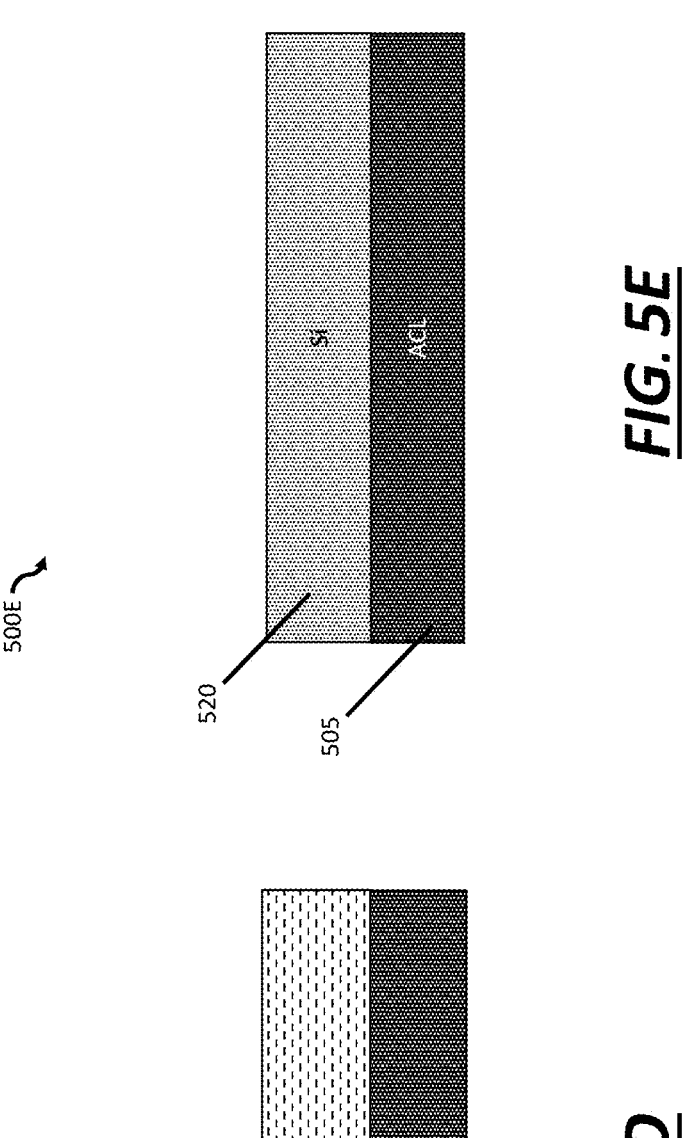

Referring to FIG. 5D, illustrated is an example depiction of the material stack shown in FIG. 5C following an air break. Because the material stack shown in FIG. 5C is porous, and many of the atoms making up the protection layer 510 have dangling bonds, exposing the protection layer 510 to an air break causes oxygen to bond with the atoms in the protection layer 510, creating the oxidized protection layer 515. An oxidized protection layer 515 is undesirable, because oxide materials (e.g., $SiO_2$) cannot be used as a mask layer for oxide etching. As such, a reduction process may be utilized prior to exposing the material stack to an air break to reduce the amount of oxidation that occurs.

Referring to FIG. 5E, illustrated is an example depiction of the material stack shown in FIG. 5C following a reduction post-treatment process. As described herein, exposing material stack of FIG. 5C to air that includes oxygen results in oxidation of the protection layer 510. To address this issue, a reduction process can be performed utilizing hydrogen ($H_2$) following the formation of the protection layer 510. The reduced protection layer 520 results from the reduction process. In an embodiment, the reduction process can be performed after exposing the material stack to a gas mixture including oxygen (e.g., an air break). The reduction process can include exposing the protection layer 510 of FIG. 5C to a hydrogen plasma for predetermined amounts of time. In an example reduction process, a high-frequency source power in a range of 0-1500 W, a low-frequency bias power in a range of 0-1900 W, a pressure in a range of 5-700 mTorr, and a temperature in a range of 0-90 degrees Celsius can be utilized. Gases that may be used to reduce the protection layer 510 of FIG. 5C can include, but are not limited to, hydrogen ($H_2$) in the range of 5-485 sccm.

Figures 5F, 5G:
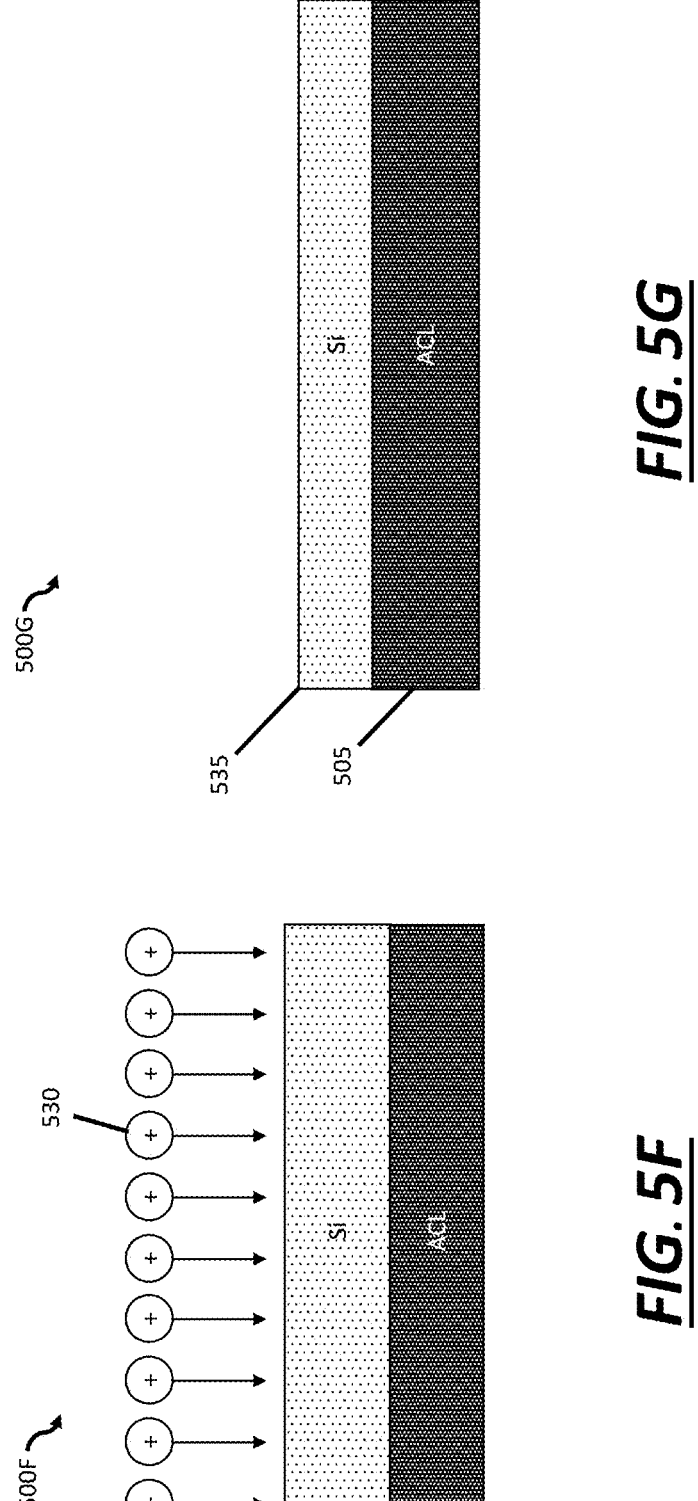

Referring to FIG. 5F, illustrated is a densification process that may be applied to the material stack shown in FIG. 5C. The densification process shown in FIGS. 5F and 5G may be performed in addition to, or as an alternative to, the reduction process described in connection with FIG. 5E. To densify the protection layer 510 of FIG. 5C, ion sputtering can be utilized, which reduces the number of dangling bonds in the protection layer 510. In this example, argon (Ar) ions 530 are utilized in the ion sputtering process. In an example densification process, a high-frequency source power in a range of 0-1500 W, a low-frequency bias power in a range of 0-1900 W, a pressure in a range of 5-700 mTorr, and a temperature in a range of 0-90 degrees Celsius may be utilized. Gases that may be used to densify the protection layer 510 can include, but are not limited to, argon (Ar) in the range of 15-1150 sccm, krypton (Kr) in the range of 0-306 sccm, helium (He) in the range of 24-2387 sccm, and nitrogen ($N_2$) in the range of 15-1300 sccm.

Referring to FIG. 5G, illustrated is the material stack of FIG. 5C following the densification process described in connection with FIG. 5F. As shown, the ion sputtering process causes the protection layer 510 of FIG. 5C to become the densified protection layer 535. After performing the ion sputtering process described herein, the number of dangling bonds in the densified protection layer 535 is reduced, and therefore fewer unsaturated sites in the densified protection layer 535 can bond to oxygen, for example, after an air break. In one or more embodiments, the reduction process described in connection with FIG. 5E may be performed before or after the densification process described in connection with FIGS. 5F and 5G.

Figures 6A, 6B, 6C, 6D:
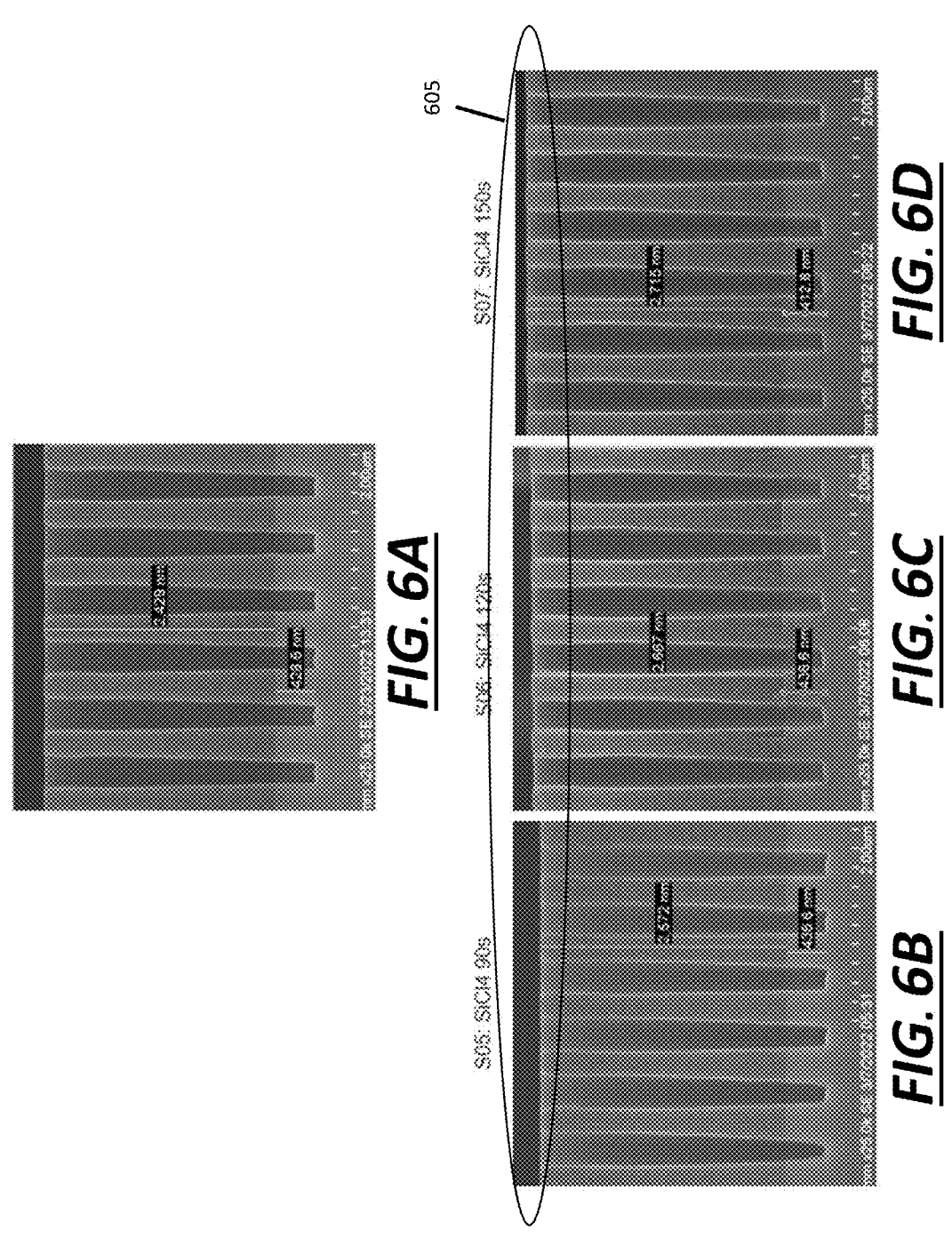
FIGS. 6A, 6B, 6C, and 6D are photographs showing the formation of a silicon polymer layer on top of an amorphous carbon layer (ACL), according to an embodiment.

Referring to FIGS. 6A, 6B, 6C, and 6D, shown are photographs showing the formation of a silicon polymer layer (e.g., the protection layer 420A or 420B, the protection layer 510, etc.), on top of an ACL, according to an embodiment. FIG. 6A shows the ACL mask on a substrate layer prior to the deposition of any protection layer. FIGS. 6B, 6C, and 6C show the ACL mask of FIG. 6A, each exposed to $SiCl_4$ for the deposition of a Si protection layer, based on the techniques described herein. FIG. 6B shows the material stack of FIG. 6A exposed to a $SiCl_4$ for 90 seconds, FIG. 6C shows the material stack of FIG. 6A exposed to a $SiCl_4$ for 120 seconds, and FIG. 6D shows the material stack of FIG. 6A exposed to a $SiCl_4$ for 150 seconds. The circled region 605 shows evidence of the formation of the Si polymer on top of the hard mask.

FIGS. 7A, 7B, 7C, and 7D show EDS scans showing the formation of a silicon polymer layer on top of an ACL, according to an embodiment. In this example, each of the EDS scans in FIGS. 7A-7D are Si EDS scans. FIG. 7A shows the ACL mask on top of a Si substrate layer prior to the formation of a protection layer. FIGS. 7B, 7B, and 7C show Si EDS scans of an example material stack following the formation of a Si polymer layer. FIG. 7B shows the material stack of FIG. 7A exposed to a $SiCl_4$ at 20 mTorr, FIG. 7C shows the material stack of FIG. 7A exposed to a $SiCl_4$ at 50 mTorr, and FIG. 7D shows the material stack of FIG. 7A exposed to a $SiCl_4$ at 80 mTorr. As shown by the increased density of the EDS maps, each of FIGS. 7B, 7C, and 7D indicate the formation of the Si layer at the top of the material stack.

Figures 8A, 8B, 8C:
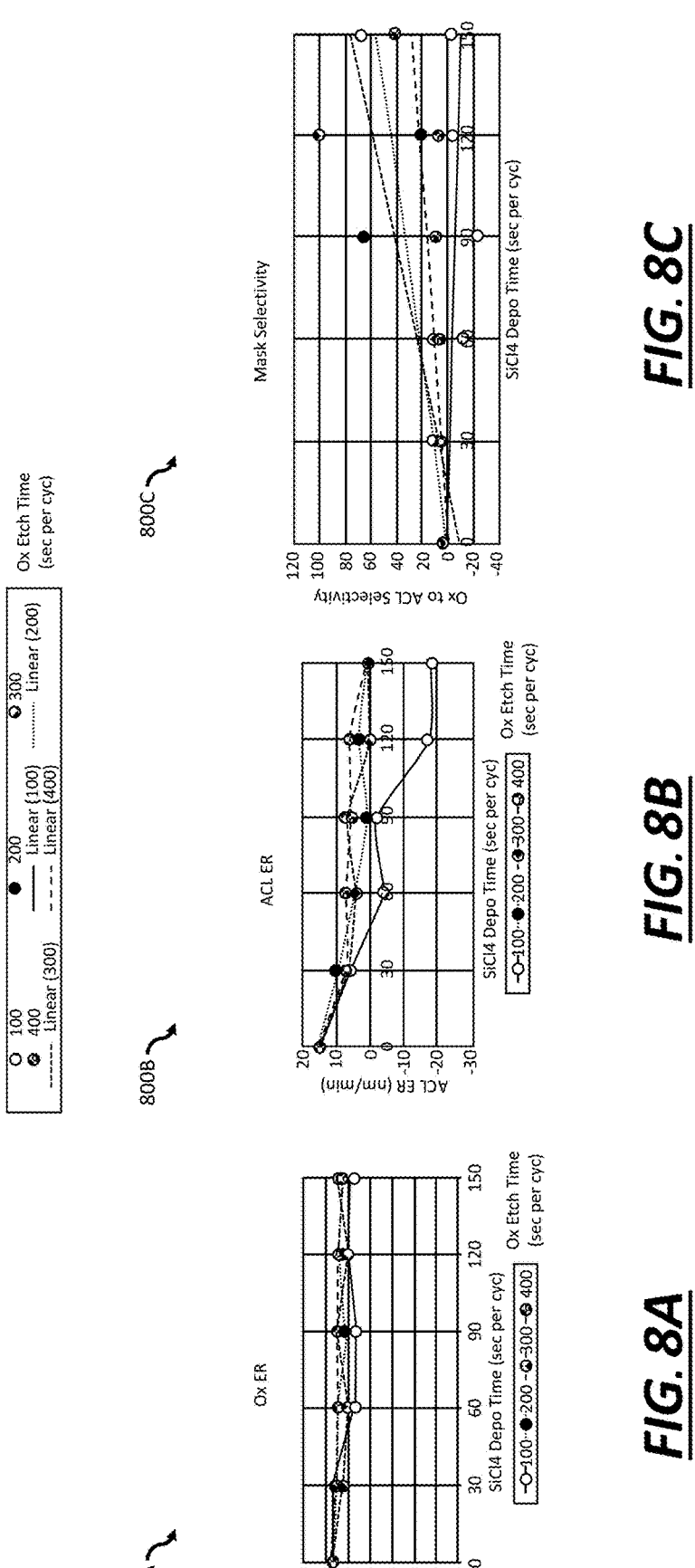
FIGS. 8A, 8B, and 8C depict example graphs showing relationships between etch time and the etch rate of an oxide layer, according to an embodiment.

Referring to FIGS. 8A, 8B, and 8C, depicted are example graphs 800A, 800B and 800C, respectively, showing relationships between etch time and the etch rate of an oxide layer, between etch time and an ACL, and between etch time and mask selectivity, according to an embodiment. As described herein, the protection layer deposition process and the etching process can be repeated in a number of cycles to achieve the desired etching characteristics. Relationships between the etch rate of various materials used in the material stacks and the deposition time of $SiCl_4$ (e.g., the protection layer) are shown in the graphs 800A, 800B, and 800C, and in Table 1 below.

As shown in the graph 800A of FIG. 8A, when the $SiCl_4$ is used to form a protection layer, the substrate layer etch rate (shown here as the "Ox ER") in nanometers per minute slightly decreases, but otherwise remains fairly constant as the $SiCl_4$ deposition time increases. As shown in the graph 800B of FIG. 8B, the hard mask etch rate (shown here as the "ACL ER") in nanometers per minute decreases as the $SiCl_4$ deposition time increases. This indicates that the etch rate of the hard mask decreases as a thicker protection layer is utilized, indicating that the protection layer protects the hard mask from the etching process. As shown in the graph 800C of FIG. 8C, the substrate to hard mask selectivity increases as the $SiCl_4$ deposition time increases. Table 1 below shows data that reflects the increased hard mask selectivity.

TABLE 1

| Ox Etch | Si Depo (sec) | | | | |
|---|---|---|---|---|---|
| (sec) | 30 | 60 | 90 | 120 | 150 |
| 100 | 9.4 | −11.9 | −23.2 | −2.9 | −2.7 |
| 200 | 5.8 | 11.4 | 64.5 | 16.9 | 65.9 |
| 300 | 7.8 | 11.6 | 8.0 | Infinity | 67.4 |
| 400 | 7.7 | 7.7 | 9.9 | 9.2 | 43 |

Figures 9A, 9B, 9C:
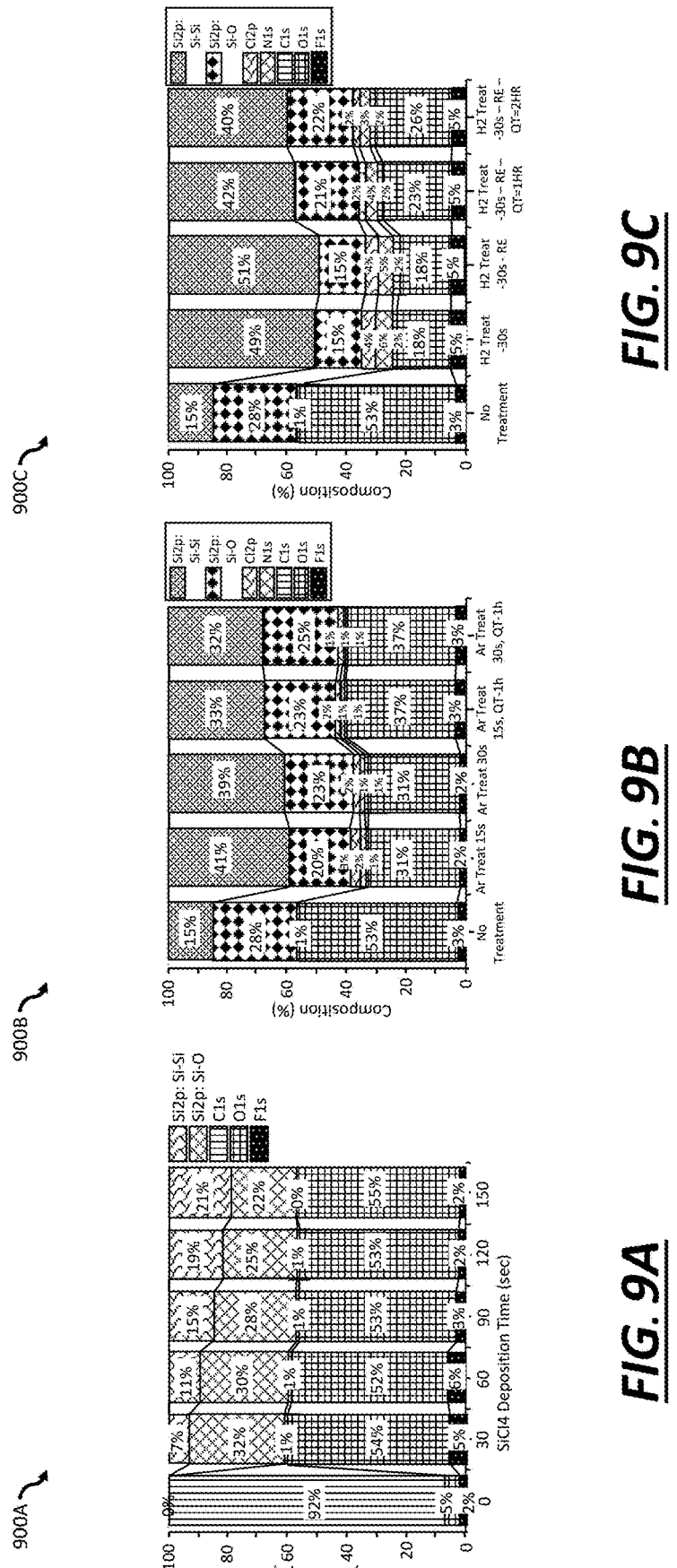
FIGS. 9A, 9B, and 9C show graphs indicating material composition of an example layer stack undergoing formation and densification of an example protection layer, according to an embodiment.

Referring to FIGS. 9A, 9B, and 9C, illustrated are graphs 900A, 900B, and 900C, respectively, each indicating the respective material composition of an example layer stack after various process stages described herein. The graph 900A shows the composition of a material stack composition following the formation of a protection layer using $SiCl_4$ based on the techniques described herein. As shown in the graph 900A, the percentage of Si-to-Si bonds relative to the percentage of Si-to-O bonds increases as the deposition time of $SiCl_4$ increases. The graph 900B shows the composition of a material stack after formation of a protection layer at various stages of densification using Ar ion sputtering. As shown in the graph 900B, the percentage of Si to Si bonds relative to Si to O bonds increases when Ar ion sputtering is applied versus the material stack without treatment. Likewise, the overall percentage of oxygen in the material stack decreases when Ar sputtering is applied. The graph 900C shows the composition of a material stack after formation of a protection layer at various stages of reduction using $H_2$. As shown in the graph 900C, the percentage of Si to Si bonds relative to Si to O bonds increases when $H_2$ ion reduction is applied versus the material stack without treatment. Likewise, the overall percentage of oxygen in the material stack decreases when $H_2$ reduction is applied.

Figures 10, 11:
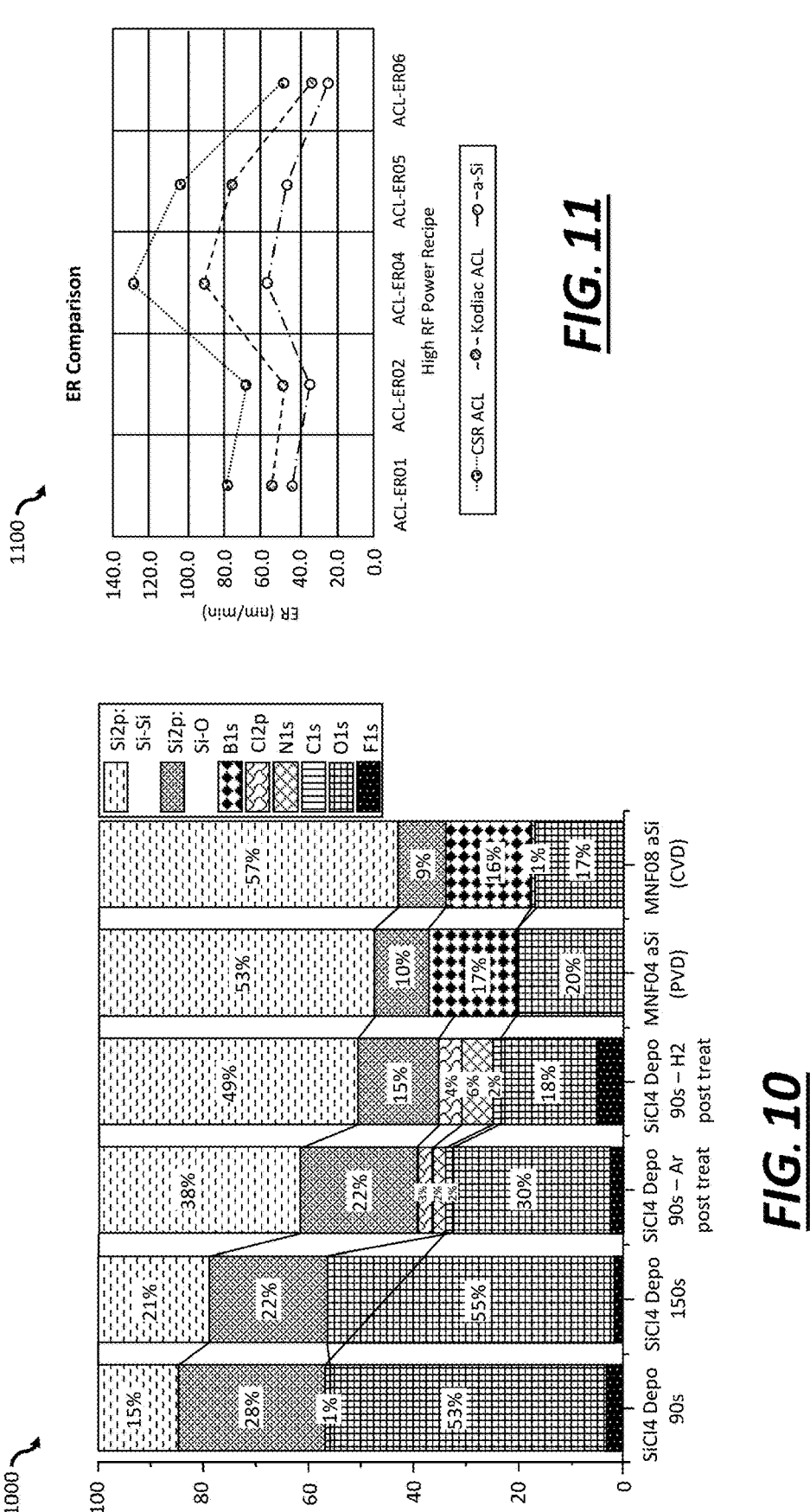
FIG. 10 shows an example graph indicating material composition of an example layer stack undergoing densification using argon and hydrogen, followed by etching, according to an embodiment.
FIG. 11 shows an example graph that compares the relative etch rates of ACL and amorphous silicon, according to an embodiment.

FIG. 10 shows an example graph 1000 indicating material composition of an example layer stack undergoing densification using argon and hydrogen, followed by etching, according to an embodiment. The graph 1000 compares the material composition of example layer stacks that have undergone various process stages described herein with example layer stacks that have been formed with amorphous silicon. As shown, the use of post-treatment with hydrogen (for reduction) or argon (for densification) enables the material stack with the silicon film protection layer to have similar composition as stacks including amorphous silicon formed using PVD or CVD using amorphous silicon.

FIG. 11 shows an example graph 1100 that compares relative etch rates of ACL and amorphous silicon, according to an embodiment. The graph 1100 shows compares the etch rate (shown in the graph as "ER") of mid-temperature (MT ACL; at about 400° C.) and high-temperature (HT ACL; at about 600° C.) mask layers with protection layers treated using the techniques described herein, with etch rate of an amorphous silicon layer. Explained in connection with FIG. 10, the post-treatments increase the Si content overall in the deposited Si film. As shown in the graph 1100, this allows the etch resistance of the hard mask layer with the Si film to have a similar etch rate to an amorphous silicon layer.

Figures 12A, 12B, 12C, 12D, 12E, 12F, 12G, 12H:
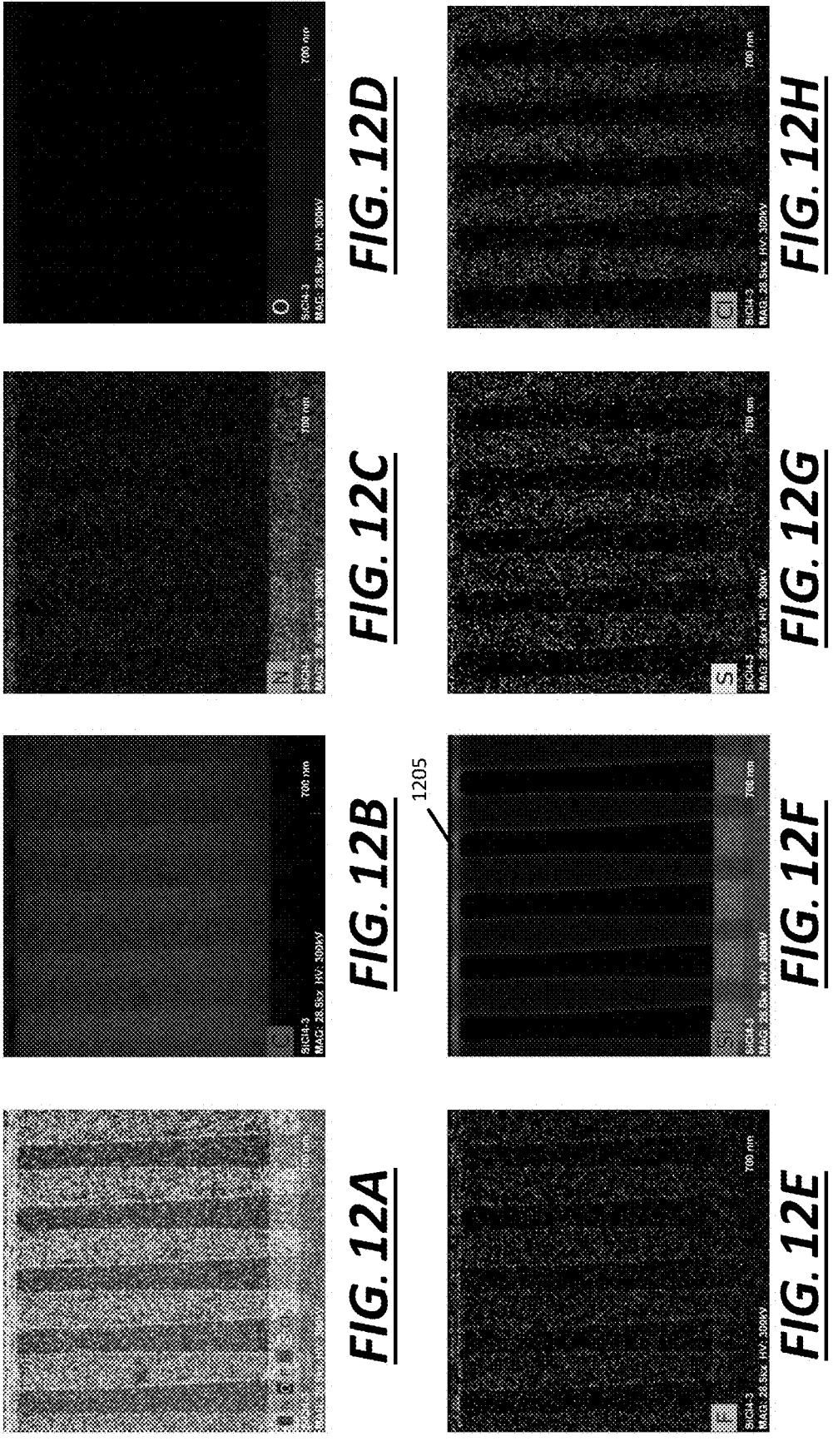

FIGS. 12A, 12B, 13C, 12D, 12E, 12F, 12G, and 12H show example EDS scans of an example material stack on which a protection layer has been deposited and densified, according to an embodiment. FIG. 12A shows a composite EDS map with points for carbon (C), nitrogen (N), oxygen (O), fluorine (F), silicon (Si), sulfur (S), and chlorine (Cl). FIG. 12B is the EDS scan of FIG. 12A showing the points corresponding to carbon (C). FIG. 12C is the EDS scan of FIG. 12A showing the points corresponding to nitrogen (N). FIG. 12D is the EDS scan of FIG. 12A showing the points corresponding to oxygen (O). FIG. 12E is the EDS scan of FIG. 12A showing the points corresponding to fluorine (F). FIG. 12F is the EDS scan of FIG. 12A showing the points corresponding to silicon (Si). As shown in FIG. 12F, there is a region 1205 that indicates the presence of the deposited protection layer, which in this example includes a silicon polymer. FIG. 12G is the EDS scan of FIG. 12A showing the points corresponding to sulfur (S). FIG. 12H is the EDS scan of FIG. 12A showing the points corresponding to chlorine (Cl).

FIGS. 13A, 13B, 13C, and 13D show example photographs of an example layer stack that has undergone a HAR etching process using the techniques described herein, according to an embodiment. FIG. 13A shows an example material stack following the formation of one or more trenches in a mask layer, and prior to performing the formation and densification/reduction of the protection layer using the techniques described herein. Various attributes of the material stack of FIG. 13A are provided below Table 2.

TABLE 2

| | |
|---|---|
| Mask Layer (ACL) Thickness (nm) | 2429 |
| Neck critical dimension (CD) (nm) | 325.4 |
| Bow CD (nm) at Mask | 335.8 |
| Top CD (nm) | 236.6 |
| Substrate Etch Depth (nm) | 429 |

FIG. 13B shows the material stack of FIG. 13A following an example etching process that does not implement the protection layer as described herein. Instead, an example etch for 1200 seconds was performed, which results in deformities, which are indicated in the data shown in Table 3 below. FIG. 13C shows the material stack of FIG. 13A that has undergone an etching process that includes the use of a protection layer and densification/reduction techniques (e.g., the techniques described in connection with FIGS. 4A-4E and FIGS. 5A-5G, etc.). The material stack of FIG. 13C was exposed to a 90 seconds of $SiCl_4$ deposition to form the protection layer, followed by 300 seconds of etching, for four cycles (e.g., resulting in 1200 seconds of total etching). As shown, the use of a protection layer reduces the deformities in the substrate layer, which results from increased mask selectivity. The improvements are indicated in the data shown in Table 3 below.

FIG. 13D shows the material stack of FIG. 13A that has undergone an etching process that includes the use of a protection layer and densification/reduction techniques (e.g., the techniques described in connection with FIGS. 4A-4E and FIGS. 5A-5G, etc.). The material stack of FIG. 13D was exposed to a 90 seconds of $SiCl_4$ deposition to form the protection layer, followed by 200 seconds of etching, for six cycles (e.g., resulting in 1200 seconds of total etching). As shown, the use of a protection layer increases mask selectivity, thereby reducing the deformities in the substrate layer after etching is performed. The improvements are indicated in the data shown in Table 3 below.

TABLE 3

|  | FIG. 13B | FIG. 13C | FIG. 13D |
|---|---|---|---|
| Mask Layer (ACL) Thickness (nm) | 2127 | 2294 | 2413 |
| Neck Critical Dimension (CD) (nm) | 321.5 | 326.1 | 310.2 |
| Bow CD (nm) at Mask | 353.2 | 366.5 | 362.5 |
| Top CD (nm) | 271.2 | 303.6 | 287.8 |
| Substrate Etch Depth (nm) | 1572 | 1508 | 1461 |
| Substrate ER (nm/min) | 57.2 | 54.0 | 51.6 |
| Mask Layer ER (nm/min) | 15.1 | 6.8 | 0.8 |
| Substrate to Mask Selectivity | 3.8 | 8.0 | 64.5 |

Figure 14:
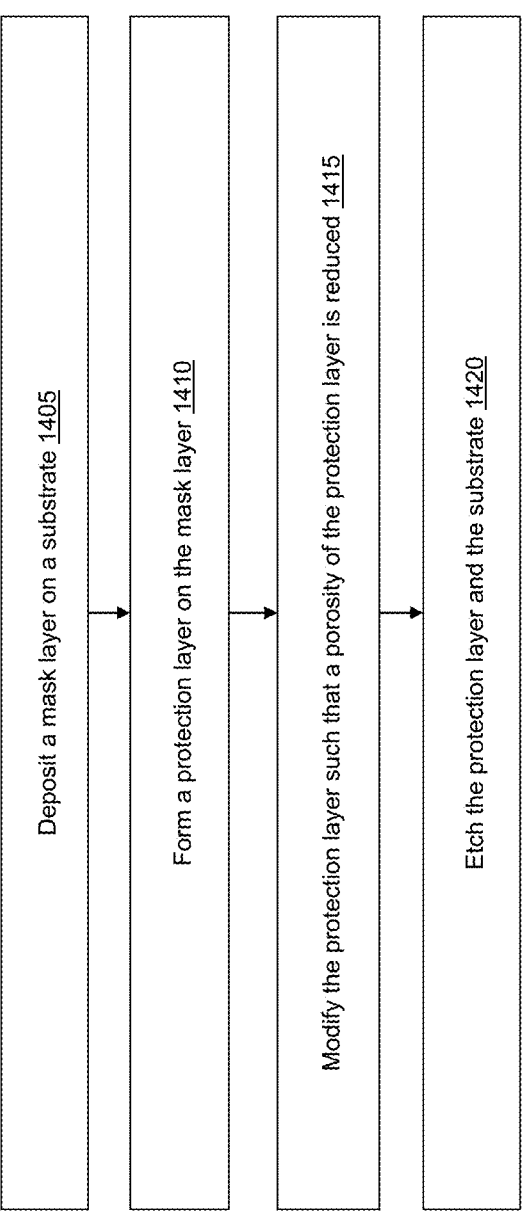
FIGS. 14, 15, and 16 show example flow diagrams of example methods for densifying or reducing protection layers as described herein, according to an embodiment.

FIG. 14 illustrates a flow diagram of a method 1400 for densifying or reducing a protection layer as described herein, according to an embodiment. The method 1400 may include steps 1405-1420. However, other embodiments may include additional or alternative steps, or may omit one or more steps altogether.

Referring to step 1405, the method 1400 includes depositing a mask layer (e.g., the mask layer 415, the mask layer 505, etc.) on a substrate (e.g., the substrate 410). The mask layer may be a hard mask comprising silicon, metal materials, or a dielectric material, among others. The mask layer is a hard mask comprising an ACL. Forming the mask layer may include forming a trench or hole in the mask layer that exposes a portion of the substrate. To form the mask layer, process steps described in connection with FIG. 4A or FIG. 5A can be performed. For example, the mask layer may be formed using any suitable material formation technique, including an in-situ process in a plasma etcher, ALD, CVD, PVD, or PECVD, among others.

Referring to step 1410, the method 1400 includes forming a protection layer (e.g., the protection layer 420A or 420B, the protection layer 510, etc.) on the mask layer. Forming the protection layer may include forming the protection layer such that a portion of the substrate is exposed via the mask layer. Forming the protection layer may include exposing the mask layer to a $SiH_4$ plasma. The protection layer may include a silicon material or pseudo-silicon material. Forming the protection layer may increase an etch resistance of the mask layer. To form the protection layer, process steps described in connection with FIG. 4B or FIGS. 5B and 5C may be performed. Forming the protection layer may include exposing the mask layer to $SiCl_4$.

Referring to step 1415, the method 1400 includes modifying the protection layer such that a porosity of the protection layer is reduced. Modifying the protection layer may include densifying the protection layer using argon sputtering. Modifying the protection layer may include exposing the protection layer to a hydrogen plasma. To modify the protection layer by densifying the protection layer, process steps described in connection with FIGS. 5F and 5G may be performed. To modify the protection layer by reducing the protection layer using a hydrogen treatment, the process steps described in connection with FIG. 5E may be performed.

Referring to step 1420, the method 1400 includes etching the protection layer and the substrate. To etch the protection layer and the substrate, the process steps described in connection with FIG. 4C may be performed. Any suitable etching technique may be utilized to etch the material stack, including a dry etching process, a wet etching process, or a plasma etching process, among others. The material stack may be etched for a predetermined amount of time. The process steps of the method 1400 may be performed for a predetermined number of cycles. For example, after etching the protection layer and the substrate, the method 1400 can include forming a second protection layer on the mask layer after etching the protection layer and the substrate, modifying the second protection layer such that a porosity of the second protection layer is reduced (e.g., through argon sputtering, hydrogen treatment, etc.), and etching the second protection layer and the substrate. This process can be repeated until predetermined etching characteristics have been achieved.

Figure 15:
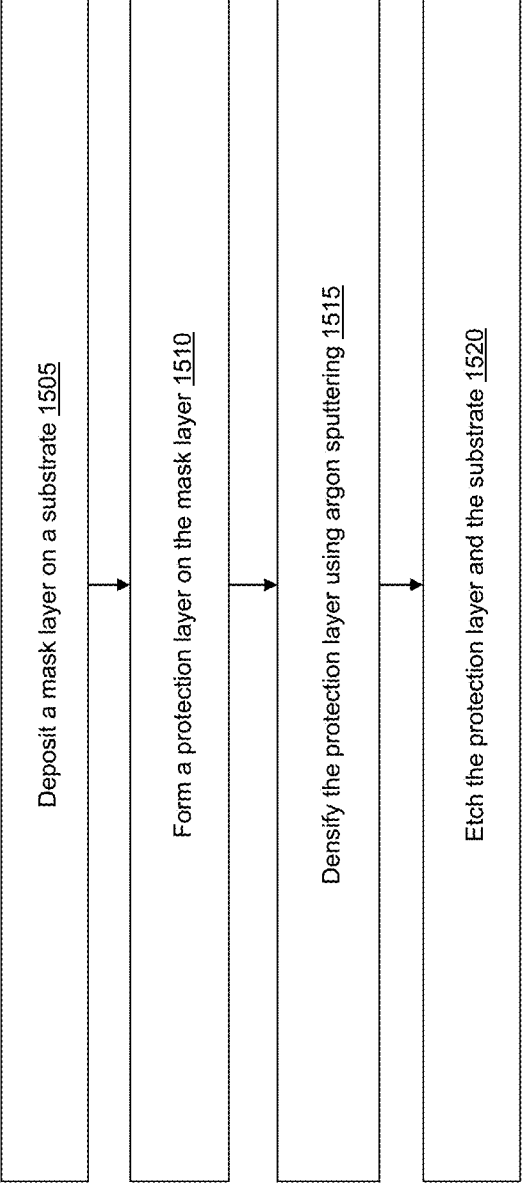

FIG. 15 illustrates a flow diagram of a method 1500 for densifying or reducing a protection layer as described herein, according to an embodiment. The method 1500 may include steps 1505-1520. However, other embodiments may include additional or alternative steps, or may omit one or more steps altogether.

Referring to step 1505, the method 1500 includes depositing a mask layer (e.g., the mask layer 415, the mask layer 505, etc.) on a substrate (e.g., the substrate 410). The mask layer may include a hard mask comprising a silicon, metal materials, or a dielectric material, among others. The mask layer is a hard mask comprising an ACL. Forming the mask layer may include forming a trench or hole in the mask layer that exposes a portion of the substrate. To form the mask layer, process steps described in connection with FIG. 4A or FIG. 5A can be performed. For example, the mask layer may be formed using any suitable material formation technique, including an in-situ process in a plasma etcher, ALD, CVD, PVD, or PECVD, among others.

Referring to step 1510, the method 1500 includes forming a protection layer (e.g., the protection layer 420A or 420B, the protection layer 510, etc.) on the mask layer. The protection layer may include a silicon material or pseudo-silicon material. Forming the protection layer may increase an etch resistance of the mask layer. To form the protection layer, process steps described in connection with FIG. 4B or FIGS. 5B and 5C may be performed. Forming the protection layer may include exposing the mask layer to $SiCl_4$.

Referring to step 1515, the method 1500 includes densifying the protection layer using argon sputtering. Argon sputtering can reduce the number of dangling bonds in the atoms of the protection layer, thereby reducing its overall porosity and the propensity to oxidize when exposed to air. To modify the protection layer by densifying the protection layer, process steps described in connection with FIGS. 5F and 5G may be performed. Additionally, the protection layer may be modified before or after argon sputtering by reducing the protection layer using a hydrogen treatment. To reduce the protection layer, the process steps described in connection with FIG. 5E may be performed.

Referring to step 1520, the method 1500 includes etching the protection layer and the substrate. To etch the protection layer and the substrate, the process steps described in connection with FIG. 4C may be performed. Any suitable etching technique may be utilized to etch the material stack, including a dry etching process, a wet etching process, or a plasma etching process, among others. The material stack may be etched for a predetermined amount of time. The process steps of the method 1500 may be performed for a predetermined number of cycles. For example, after etching the protection layer and the substrate, the method 1500 can include forming a second protection layer on the mask layer after etching the protection layer and the substrate, modifying the second protection layer such that a porosity of the second protection layer is reduced (e.g., through argon sputtering, hydrogen treatment, etc.), and etching the second protection layer and the substrate. This process can be repeated until predetermined etching characteristics have been achieved.

Figure 16:
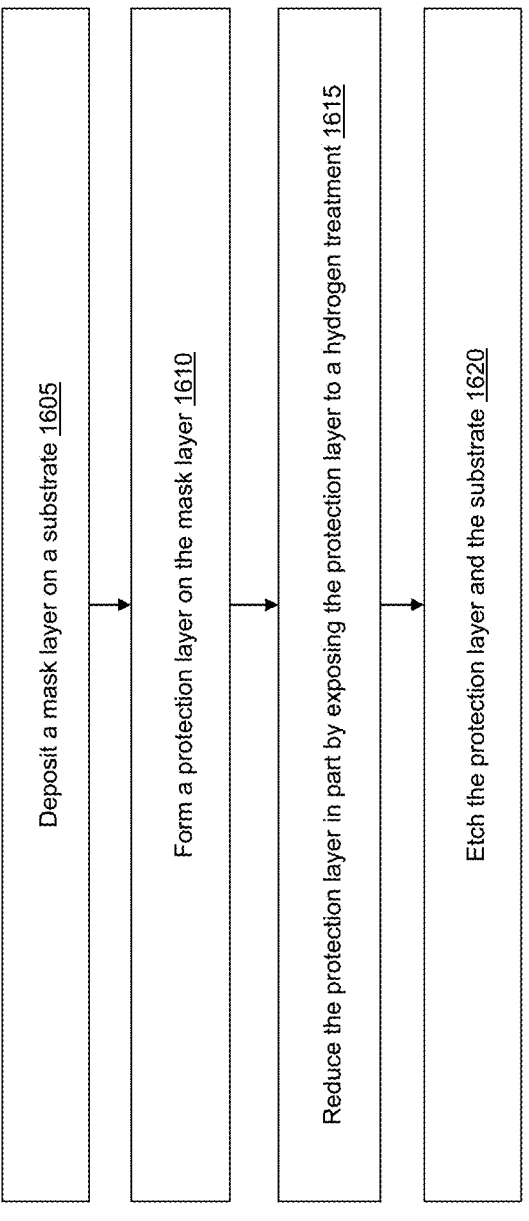

FIG. 16 illustrates a flow diagram of a method 1600 for densifying or reducing a protection layer as described herein, according to an embodiment. The method 1600 may include steps 1605-1620. However, other embodiments may include additional or alternative steps, or may omit one or more steps altogether.

) Referring to step 1605, the method 1600 includes depositing a mask layer (e.g., the mask layer 415, the mask layer 505, etc.) on a substrate (e.g., the substrate 410). Depositing the mask layer may include forming a trench or hole in the mask layer (e.g., via photolithography, selective formation or etching, etc.) that exposes a portion of the substrate. The mask layer may be a hard mask comprising a silicon, metal materials, or a dielectric material, among others. The mask layer is a hard mask comprising an ACL. Forming the mask layer may include forming a trench or hole in the mask layer that exposes a portion of the substrate. To form the mask layer, process steps described in connection with FIG. 4A or FIG. 5A can be performed. For example, the mask layer may be formed using any suitable material formation technique, including an in-situ process in a plasma etcher, ALD, CVD, PVD, or PECVD, among others.

Referring to step 1610, the method 1600 includes forming a protection layer (e.g., the protection layer 420A or 420B, the protection layer 510, etc.) on the mask layer. Forming the protection layer may include forming the protection layer such that a portion of the substrate is exposed via the mask layer. The protection layer may include a silicon material or pseudo-silicon material. Forming the protection layer may increase an etch resistance of the mask layer. To form the protection layer, process steps described in connection with FIG. 4B or FIGS. 5B and 5C may be performed. Forming the protection layer may include exposing the mask layer to $SiCl_4$.

Referring to step 1615, the method 1600 includes reducing the protection layer in part by exposing the protection layer to a hydrogen treatment. Hydrogen treatment can cause dangling bonds in the atoms of the protection layer to bond with the hydrogen, thereby reducing its overall porosity and the propensity to oxidize when exposed to air. To reduce the protection layer using the hydrogen treatment, the process steps described in connection with FIG. 5E may be performed. Additionally, the protection layer may be modified by densifying the protection layer using argon sputtering before or after the hydrogen treatment. To densify the protection layer using argon sputtering, the process steps described in connection with FIGS. 5F and 5G may be performed.

Referring to step 1620, the method 1600 includes etching the protection layer and the substrate. Etching the substrate may be performed via the trench in the mask layer. To etch the protection layer and the substrate, the process steps described in connection with FIG. 4C may be performed. Any suitable etching technique may be utilized to etch the material stack, including a dry etching process, a wet etching process, or a plasma etching process, among others. The material stack may be etched for a predetermined amount of time. The process steps of the method 1600 may be performed for a predetermined number of cycles. For example, after etching the protection layer and the substrate, the method 1600 can include forming a second protection layer on the mask layer after etching the protection layer and the substrate, modifying the second protection layer such that a porosity of the second protection layer is reduced (e.g., through argon sputtering, hydrogen treatment, etc.), and etching the second protection layer and the substrate. This process can be repeated until predetermined etching characteristics have been achieved.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronic device, and may, for example, be a base substrate structure, such as a semiconductor wafer, reticle, or a layer on or overlying a base substrate structure such as a thin film. Thus, the substrate is not limited to any particular base structure, underlying layer or overlying layer, patterned or un-patterned, but rather is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
depositing a mask layer on a substrate;
forming a protection layer on the mask layer;
modifying, prior to an air break, the protection layer such that a porosity of the protection layer is reduced and that a number of dangling bonds to form an oxide during the air break is reduced; and
etching the protection layer and the substrate.

2. The method of claim 1, wherein the mask layer is a hard mask comprising silicon or metal materials.

3. The method of claim 1, wherein the mask layer is a hard mask comprising an amorphous carbon layer (ACL).

4. The method of claim 1, wherein forming the protection layer comprises exposing the mask layer to a $SiH_4$ plasma.

5. The method of claim 1, wherein modifying the protection layer comprises densifying the protection layer using argon, helium, krypton, or xenon sputtering.

6. The method of claim 5, wherein modifying the protection layer comprises exposing the protection layer to a hydrogen plasma.

7. The method of claim 1, further comprising:

forming a second protection layer on the mask layer after etching the protection layer and the substrate;

modifying the second protection layer such that a porosity of the second protection layer is reduced; and etching the second protection layer and the substrate.

8. The method of claim 1, wherein the protection layer comprises a silicon-containing material.

9. The method of claim 1, wherein forming the protection layer increases an etch resistance of the mask layer.

10. The method of claim 1, wherein forming the mask layer comprises forming a trench or a hole in the mask layer that exposes a portion of the substrate.

11. A method, comprising:

depositing a mask layer on a substrate;

forming a protection layer on the mask layer;

densifying, prior to an air break, the protection layer using argon sputtering such that a number of dangling bonds to form an oxide during the air break is reduced; and etching the protection layer and the substrate.

12. The method of claim 11, wherein the mask layer is a hard mask comprising silicon or metal materials.

13. The method of claim 11, wherein the mask layer is a hard mask comprising an amorphous carbon layer (ACL).

14. The method of claim 11, further comprising:

forming a second protection layer on the mask layer after etching the protection layer and the substrate;

modifying the second protection layer such that a porosity of the second protection layer is reduced; and etching the second protection layer and the substrate.

15. The method of claim 14, wherein modifying the second protection layer comprises exposing the second protection layer to a hydrogen plasma.

16. A method, comprising:

depositing a mask layer on a substrate;

forming a protection layer on the mask layer;

reducing, prior to an air break, the protection layer in part by exposing the protection layer to a hydrogen treatment such that a number of dangling bonds to form an oxide during the air break is reduced; and etching the protection layer and the substrate.

17. The method of claim 16, further comprising:

forming a second protection layer on the mask layer after etching the protection layer and the substrate;

densifying the second protection layer using argon sputtering; and etching the second protection layer and the substrate.

18. The method of claim 16, wherein depositing the mask layer comprises forming a trench or a hole in the mask layer that exposes a portion of the substrate.

19. The method of claim 18, wherein etching the substrate is performed via the trench or the hole in the mask layer.

20. The method of claim 16, wherein forming the protection layer comprises forming the protection layer such that a portion of the substrate is exposed via the mask layer.

* * * * *